United States Patent
Tokuda et al.

(10) Patent No.: US 10,320,146 B2
(45) Date of Patent: Jun. 11, 2019

(54) SEMICONDUCTOR LIGHT-EMITTING ELEMENT, MANUFACTURING METHOD OF SEMICONDUCTOR LIGHT-EMITTING ELEMENT, AND SEMICONDUCTOR DEVICE

(71) Applicant: Sony Corporation, Tokyo (JP)

(72) Inventors: Kota Tokuda, Kanagawa (JP); Takayuki Kawasumi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/633,363

(22) Filed: Feb. 27, 2015

(65) Prior Publication Data

US 2015/0255950 A1  Sep. 10, 2015

(30) Foreign Application Priority Data

Mar. 10, 2014 (JP) ................................. 2014-046042

(51) Int. Cl.
*H01S 5/22* (2006.01)
*H01S 5/042* (2006.01)
(Continued)

(52) U.S. Cl.
CPC .............. *H01S 5/0425* (2013.01); *H01S 5/22* (2013.01); *H01S 5/2214* (2013.01);
(Continued)

(58) Field of Classification Search
CPC .... H01S 5/2214–5/2216; H01S 5/2222; H01S 5/2226
See application file for complete search history.

(56) References Cited

U.S. PATENT DOCUMENTS

| 6,064,683 A * | 5/2000 | Johnson .............. H01S 5/18308 257/E33.069 |
| 7,221,691 B2 * | 5/2007 | Johnson .............. H01S 5/18391 372/45.01 |

(Continued)

FOREIGN PATENT DOCUMENTS

| JP | 10-190142 | 7/1998 |
| JP | H11-068227 | * 3/1999 |
| JP | 2002-064247 | * 2/2002 |

OTHER PUBLICATIONS

Nakamura, Shuji et al., "Ridgegeometry InGaN Multlquantumstructure Laser Diodes" American Institute of Physics, Applied Physics Letters(10) 69, 1477, Sep. 2, 1996.

*Primary Examiner* — Tod T Van Roy
(74) *Attorney, Agent, or Firm* — Michael Best & Friedrich LLP

(57) ABSTRACT

A semiconductor light-emitting element includes a laminated structure which has an active layer between a first conductivity-type semiconductor layer and a second conductivity-type semiconductor layer, a first semiconductor layer which includes at least the first conductivity-type semiconductor layer of the laminated structure, an insulation film which is formed on the first semiconductor layer and has an opening, and a second semiconductor layer which is formed on the insulation film and includes at least the second conductivity-type semiconductor layer of the laminated structure. The second semiconductor layer includes a first region facing the opening of the insulation film and a second region not facing the opening, and the second region has a portion with a higher impurity concentration than the first region.

18 Claims, 14 Drawing Sheets

(51) Int. Cl.
*H01S 5/30* (2006.01)
*H01S 5/32* (2006.01)
H01S 5/343 (2006.01)
H01S 5/20 (2006.01)

(52) U.S. Cl.
CPC .......... *H01S 5/2226* (2013.01); *H01S 5/3054* (2013.01); *H01S 5/3213* (2013.01); H01S 5/2009 (2013.01); H01S 5/34333 (2013.01); H01S 2304/04 (2013.01)

(56) References Cited

U.S. PATENT DOCUMENTS

2011/0286484 A1* 11/2011 Raring .................. B82Y 20/00
372/44.011
2015/0280402 A1* 10/2015 Gubenko ................ H01S 5/221
372/50.11

* cited by examiner

SEMICONDUCTOR LIGHT-EMITTING ELEMENT, MANUFACTURING METHOD OF SEMICONDUCTOR LIGHT-EMITTING ELEMENT, AND SEMICONDUCTOR DEVICE

CROSS REFERENCE TO RELATED APPLICATIONS

This application claims the benefit of Japanese Priority Patent Application JP 2014-046042 filed Mar. 10, 2014, the entire contents of which are incorporated herein by reference.

BACKGROUND

The present disclosure relates to a semiconductor light-emitting element such as a semiconductor laser or a light-emitting diode (LED), a manufacturing method thereof, and a semiconductor device.

In the semiconductor laser, a ridge portion is formed by etching and the ridge portion is interposed by an insulation film after forming a semiconductor laminated structure on a substrate, and thereby it is possible to realize a current constriction and to obtain a low threshold current density (for example, S. Nakamura et. Al., Appl. Phys. Lett. 69 (1996) 1477). In addition, since it is possible to have a difference in refractive index inside and outside the ridge portion by selecting a material having a lower refractive index than the semiconductor as a material of the insulation film, a so-called light transverse mode is easily controlled. However, in such a structure, since an electrode area is limited to a width of the ridge portion or less, a contact resistance with the electrode or a semiconductor bulk resistance is caused to be increased, and thereby a drive voltage is increased.

Therefore, in order to reduce the above resistance while performing a current constriction, a method of forming the ridge portion by a crystal growth after forming an insulation film having an opening on the semiconductor layer is proposed (for example, Japanese Unexamined Patent Application Publication No. 10-190142).

SUMMARY

In the semiconductor light-emitting element described above, for example, as a light source application of an optical disk or a display, there is a demand for a higher output so as to realize a high speed of the optical disk or a high brightness of the display. When the higher output is realized, a further reduction of a drive voltage is desired.

It is desirable to provide a semiconductor light-emitting element, a manufacturing method thereof, and a semiconductor element which can reduce a drive voltage.

According to a first embodiment of the present disclosure, there is provided a semiconductor light-emitting element, including a laminated structure which has an active layer between a first conductivity-type semiconductor layer and a second conductivity-type semiconductor layer, a first semiconductor layer which includes at least the first conductivity-type semiconductor layer of the laminated structure, an insulation film which is formed on the first semiconductor layer and has an opening, and a second semiconductor layer which is formed on the insulation film and includes at least the second conductivity-type semiconductor layer of the laminated structure. The second semiconductor layer includes a first region facing the opening of the insulation film and a second region not facing the opening, and the second region has a portion with a higher impurity concentration than the first region.

In the semiconductor light-emitting element of the first embodiment of the disclosure, the second semiconductor layer is formed on the first semiconductor layer through the insulation film having an opening. In the second semiconductor layer, the second region not facing the opening of the insulation film includes a portion which has a higher impurity concentration than the first region facing the opening, and thereby a current path in the second semiconductor layer is expanded.

According to a second embodiment of the present disclosure, there is provided a semiconductor light-emitting element, including a laminated structure which has an active layer between a first conductivity-type semiconductor layer and a second conductivity-type semiconductor layer, a first semiconductor layer which includes at least the first conductivity-type semiconductor layer of the laminated structure, an insulation film which is formed on the first semiconductor layer and has an opening, and a second semiconductor layer which is formed on the insulation film and includes at least the second conductivity-type semiconductor layer of the laminated structure. The second semiconductor layer includes a first region facing the opening of the insulation film and a second region not facing the opening, and the second region has a smaller electrical resistivity than the first region.

In the semiconductor light-emitting element of the second embodiment of the disclosure, the second semiconductor layer is formed on the first semiconductor layer through the insulation film having an opening. In the second semiconductor layer, the second region not facing the opening of the insulation film has a smaller electrical resistivity than the first region facing the opening, and thereby a current path in the second semiconductor layer is expanded.

According to a third embodiment of the present disclosure, there is provided a semiconductor light-emitting element, including a laminated structure which has an active layer between a first conductivity-type semiconductor layer and a second conductivity-type semiconductor layer, a first semiconductor layer which includes at least the first conductivity-type semiconductor layer of the laminated structure, an insulation film which is formed on the first semiconductor layer and has an opening, and a second semiconductor layer which is formed on the insulation film and includes at least the second conductivity-type semiconductor layer of the laminated structure. The second semiconductor layer includes a first region facing the opening of the insulation film and a second region not facing the opening, and a path of carriers in the second semiconductor layer is configured so as to be expanded more than a width of the opening of the insulation film.

In the semiconductor light-emitting element of the third embodiment of the disclosure, the second semiconductor layer is formed on the first semiconductor layer through the insulation film having an opening. The second semiconductor layer includes the first region facing the opening of the insulation film and the second region not facing the opening, and a carrier path is configured to be expanded more than a width of an opening of the insulation film, and thereby a current path in the second semiconductor layer is expanded.

According to an embodiment of the disclosure, there is provided a method of manufacturing a semiconductor light-emitting element, including forming a first semiconductor layer which includes at least a first conductivity-type semiconductor layer of a laminated structure that has an active layer between the first conductivity-type semiconductor layer and a second conductivity-type semiconductor layer, forming an insulation film which has an opening on the first semiconductor layer, and forming a second semiconductor layer which includes at least the second conductivity-type semiconductor layer of the laminated structure on the insulation film. In the forming of the second semiconductor layer, a first region facing an opening of the insulation film is formed, and a second region not facing the opening is formed by selective growth after forming the first region.

In the method of manufacturing a semiconductor light-emitting element of the embodiment of the disclosure, the second semiconductor layer is formed on the first semiconductor layer through the insulation film having an opening. When forming the second semiconductor layer, the second region not facing the opening is formed by a selective growth after the first region facing the opening of the insulation film is formed, and thereby a current path in the second semiconductor layer can be expanded.

According to an embodiment of the disclosure, there is provided a semiconductor device, including a first semiconductor layer, an insulation film which is formed on the first semiconductor layer and has an opening, and a second semiconductor layer which is formed on the insulation film, in which the second semiconductor layer includes a first region facing the opening of the insulation film, and a second region not facing the opening. The second region has a portion with a higher impurity concentration than the first region or has a smaller electrical resistivity than the first region.

In the semiconductor device of the embodiment of the disclosure, the second semiconductor layer is formed on the first semiconductor layer through the insulation film having an opening, and the second semiconductor layer includes a first region facing the opening of the insulation film and a second region not facing the opening. The second region of the second semiconductor layer includes a portion which has a higher impurity concentration than the first region, or has a smaller electrical resistivity than the first region, and thereby a current path in the second semiconductor layer is expanded.

In the semiconductor light-emitting element of the first embodiment of the disclosure, the second semiconductor layer is formed on the first semiconductor layer through the insulation film having an opening. The second region not facing the opening of the insulation film in the second semiconductor layer includes a portion which has a higher impurity concentration than the first region facing the opening, and thereby it is possible to expand a current path in the second semiconductor layer and to reduce bulk resistance of the second semiconductor layer. Accordingly, it is possible to reduce a drive voltage.

In the semiconductor light-emitting element of the second embodiment of the disclosure, the second semiconductor layer is formed on the first semiconductor layer through the insulation film having an opening. The second region not facing the opening of the insulation film in the second semiconductor layer has a smaller electrical resistivity than the first region facing the opening, and thereby it is possible to expand a current path in the second semiconductor layer and to reduce a bulk resistance of the second semiconductor layer. Accordingly, it is possible to reduce a drive voltage.

In the semiconductor light-emitting element of the third embodiment of the disclosure, the second semiconductor layer is formed on the first semiconductor layer through the insulation film having an opening, the second semiconductor layer includes the first region facing the opening of the insulation film and the second region not facing the opening, and a carrier path in the second semiconductor layer is configured so as to be expanded more than a width of the opening of the insulation film. Accordingly, it is possible to expand a current path in the second semiconductor layer and to reduce a bulk resistance of the second semiconductor layer. Accordingly, it is possible to reduce a drive voltage.

In the method of manufacturing a semiconductor light-emitting element of the embodiment of the disclosure, in the forming of the second semiconductor layer on the first semiconductor layer through the insulation film having an opening, the second region not facing the opening is formed by a selective growth after the first region facing the opening of the insulation film is formed. Accordingly, it is possible to expand a current path in the second semiconductor layer and to reduce a bulk resistance. As a result, it is possible to realize a semiconductor light-emitting element which can reduce a drive voltage.

In the semiconductor device of the embodiment of the disclosure, the second semiconductor layer is formed on the first semiconductor layer through the insulation film having an opening, and the second semiconductor layer includes the first region facing the opening of the insulation film and the second region not facing the opening. The second region of the second semiconductor layer includes a portion which has a higher impurity concentration than the first region, or has a smaller electrical resistivity than the first region, and thereby it is possible to expand a current path in the second semiconductor layer and to reduce a bulk resistance. As a result, it is possible to reduce a drive voltage.

The above content is an example of the present disclosure. Effects of the disclosure are not limited to those described above. However, the effects of the disclosure may also be other different effects, or may further include other effects.

DETAILED DESCRIPTION OF EMBODIMENTS

Hereinafter, embodiments of the present disclosure will be described in detail with reference to drawings. A description will proceed in the following order.

1. Embodiment (an example of a semiconductor light-emitting element having a first region and a second region which have different impurity concentrations in a ridge portion)
2. Modification Example 1 (an example of the semiconductor light-emitting element having another laminated structure)
3. Modification Example 2 (an example in which a plurality of insulation films are formed)
4. Modification Example 3 (an example when a second region has an impurity concentration distribution)
5. Modification Example 4 (an example when a boundary between the first region and the second region is tapered)
6. Modification Example 5 (an example when having a third region on the first region)
7. Modification Example 6 (an example in which an electrode for controlling a current path is provided in the second region)

EMBODIMENTS

Configuration

Figure 1:
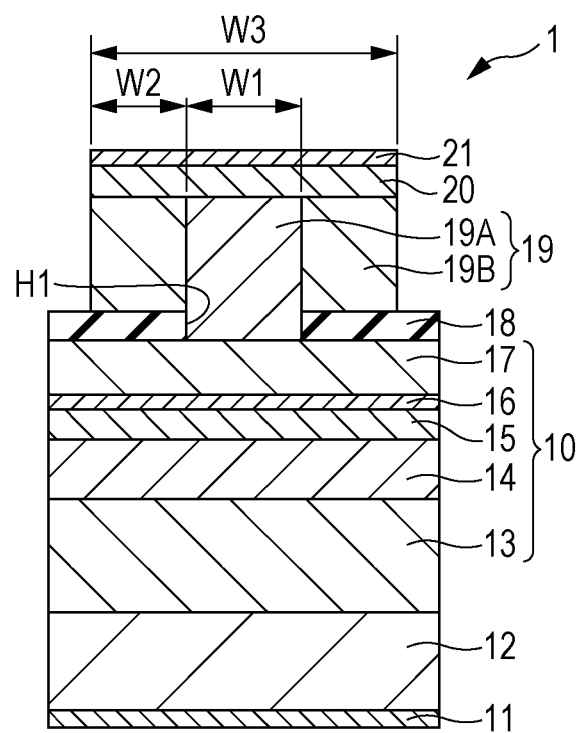
FIG. 1 is a cross-sectional view which shows a configuration of a semiconductor light-emitting element according to an embodiment of the present disclosure.

FIG. 1 shows a configuration of a semiconductor light-emitting element (semiconductor light-emitting element 1) according to an embodiment of the present disclosure. The semiconductor light-emitting element 1 is a so-called edge light-emitting type which interposes a laminated structure having an active layer between an n-type (first conductivity-type) semiconductor layer and a p-type (second conductivity-type) semiconductor layer over a pair of resonator edges which are not shown. FIG. 1 schematically shows a configuration of a main portion of the semiconductor light-emitting element 1, and can be different from an actual dimension and an actual shape.

The semiconductor light-emitting element 1 is, for example, a nitride-based semiconductor laser, and is obtained by bringing up a so-called group III-V nitride semiconductor layer on a GaN substrate (nitride semiconductor substrate). The group III-V nitride semiconductor is a gallium nitride-based compound which includes gallium (Ga) and nitrogen (N), and GaN, aluminum gallium nitride (AlGaN), aluminum gallium indium nitride (AlGaInN), or the like is exemplified as an example. These include an n-type impurity which is made of group IV and group VI elements such as silicon (Si), germanium (Ge), and oxygen (O), selenium (Se), or a p-type impurity which is made of group II and group IV elements such as magnesium (Mg), zinc (Zn), and carbon (C) when necessary.

In the semiconductor light-emitting element 1, for example, an n-type AlGaN cladding layer (n-type cladding layer 13), an n-type GAN optical guide layer (n-type optical guide layer 14), and an active layer 15 including an n-type GaInN layer (quantum well layer) and an n-type GaInN layer (barrier layer) are formed on a c-plane GaN substrate (substrate 12) in this order. A p-type AlGaN electron barrier layer (p-type electron barrier layer 16) and a p-type AlGaN cladding layer (p-type cladding layer 17) are formed on the active layer 15 in this order. Here, these n-type cladding layer 13, n-type optical guide layer 14, active layer 15, p-type electron barrier layer 16, and p-type cladding layer 17 configure the first semiconductor layer 10, and the insulation film 18 is formed on the first semiconductor layer 10.

The insulation film 18 has an opening H1 extending in a predetermined direction. A first region 19A and a second region 19B are formed on the insulation film 18 as a second semiconductor layer 19 (ridge portion, ridge stripe). The first region 19A is formed to face the opening H1, and the second region 19B is formed not to face the opening H1 (formed in a region not facing the opening H1). Specifically, the first region 19A is formed, for example, in a stripe shape in an extending direction of the opening H1, and the second region 19B is formed next to (on a side surface of) the first region 19A (so as to interpose the first region 19A between both sides). However, the second region 19B may be formed to be adjacent to at least a portion of the side surface of the first region 19A. The second semiconductor layer 19 has these first region 19A and second region 19B, and thereby a contact area between the second semiconductor layer 19 and the p-side electrode 21 is larger than an area of the opening H1 of the insulation film 18, the detail will be described later.

The first region 19A and the second region 19B are made of, for example, a p-type AlGaN; however, raw material ratios (composition ratio or impurity concentration) are different from each other. The p-side electrode 21 is formed on the second semiconductor layer 19 through a p-type GaN contact layer (p-type contact layer 20). An n-side electrode 11 is formed on a rear surface of the substrate 12. In FIG. 1, a laminated structure including the first semiconductor layer 10 and the second semiconductor layer 19 is formed so as to be interposed by the n-side electrode 11 and the p-side electrode 21; however, formation places of the n-side electrode 11 and the p-side electrode 21 are not limited thereto. The n-side electrode 11 may be electrically connected to the first semiconductor layer 10 (the n-type cladding layer 13 in detail), and the p-side electrode 21 may be electrically connected to the second semiconductor layer 19. The second semiconductor layer 19 is configured to have a compound semiconductor containing, for example, nitrogen (N) and at least one element of gallium (Ga), aluminum (Al), indium (In), and boron (B).

The n-type cladding layer 13 is made of, for example, n-type $Al_{0.06}Ga_{0.94}N$, and is doped with, for example, silicon (Si) or oxygen (O) as an n-type impurity. A thickness of the n-type cladding layer 13 is, for example, 2 µm. A thickness of the n-type optical guide layer 14 is, for example, 100 nm, and the n-type optical guide layer 14 is doped with, for example, silicon (Si) or oxygen (O) as an n-type impurity. A quantum well layer of the active layer 15 is made of, for example, $Ga_{0.92}In_{0.08}N$, and a thickness thereof is, for example, 5 nm. In this case, a light emission wavelength of a nitride semiconductor laser is about 400 nm. A barrier layer of the active layer 15 is made of, for example, $Ga_{0.98}In_{0.02}N$, and a thickness thereof is, for example, 10 nm. The number of quantum well layers in the active layer 15 is, for example, three, and the active layer 15 has a so-called multiple quantum well structure. The p-type electron barrier layer 16 is made of, for example, a p-type $Al_{0.20}Ga_{0.80}N$, and is doped with, for example, magnesium (Mg) as a p-type impurity. A thickness of the p-type electron barrier layer 16 is, for example, 10 nm. The p-type cladding layer 17 is made of, for example, $Al_{0.04}Ga_{0.95}N$, and is doped with magnesium (Mg) as a p-type impurity. A thickness of the p-type cladding layer 17 is, for example, 0.1 µm.

The insulation film 18 is made of, for example, $SiO_2$, and a film thickness of the insulation film is, for example, 100 nm. In addition, a width of an opening H1 of the insulation film 18 is, for example, 1.5 µm.

The first region 19A of the second semiconductor layer 19 is made of, for example, $Al_{0.04}Ga_{0.95}N$, and is doped with, for example, magnesium (Mg) as a p-type impurity. A thickness of the first region 19A is, for example, 0.5 µm. The second region 19B is made of, for example, $Al_{0.04}Ga_{0.96}N$, and is doped with, for example, magnesium (Mg) as a p-type impurity. A thickness of the second region 19B is, for example, 0.5 µm. However, an impurity concentration (dope amount) of the second region 19B becomes higher than an impurity concentration of the first region. A width (W1) of the first region 19A is the same as a width of the opening H1, and is, for example, 1.5 µm. Here, a configuration in which the first region 19A faces the opening H1, and the first region and the opening are formed to have the same width as each other is exemplified; however, the width W1 of the first region 19A may be larger than the width of the opening H1, or may be smaller than the width of the opening H1. A width (W2) of the second region 19B is, for example, 1.0 µm. The p-type contact layer 20 is made of GaN, and is doped with, for example, magnesium (Mg) as the p-type impurity. A thickness of the p-type contact layer 20 is, for example, 0.01 µm.

An n-side electrode 11 is made of, for example, a laminated film of Ti, Al, Pt, and Au. The p-side electrode 21 is made of, for example, a laminated film of Ni, Pt, and Au, or a laminated film of Ni and Au. In such a semiconductor light-emitting element 1, a length of a resonator is, for example, 0.8 mm, and width of a ridge stripe (a width W3 of the p-side electrode 21) is, for example, 3.0 µm.

Here, since the second semiconductor layer 19 is a p-type semiconductor layer, a transport of charges (carriers) is performed by a hole. A hole is supplied from the p-side electrode 21 and is constricted in the opening H1 of the insulation film 18. At this time, an effective width W4 of the p-side electrode 21 which contributes to a supply of a hole is narrower than a width of a contact portion between the p-side electrode 21 and the second semiconductor layer 19 when an actual width W3 of the p-side electrode 21 is sufficiently larger than the width W1 of the opening H1. Until the hole reaches near the opening H1 from the p-side electrode 21, a magnitude of a contact resistance with the p-side electrode 21 and a magnitude of a semiconductor bulk resistance are determined in accordance with the effective width (W4) of the p-side electrode 21.

The second region 19B at least partially has a higher impurity concentration (herein, p-type impurity concentration) than the first region 19A. The impurity concentration of the second region 19B is desirably set so as to obtain a sufficiently smaller resistance in the second region 19B than in the first region 19A. However, when the impurity concentration of the second region 19B is too high, a crystal quality is impaired, and this rather causes a bulk resistance to increase. Therefore, a ratio of the second region 19B to the first region 19A in impurity concentration is desirably from 2 to 20.

It is not necessary that an entire region of the second region 19B have a higher impurity concentration than the first region 19A. The second region 19B may include any portion which has a higher impurity concentration than the first region 19A. In other words, a portion of the second region 19B may have a lower impurity concentration than the first region 19A. In addition, the impurity concentration of the second region 19B does not have to be the same in the second region 19B, and may have a distribution. However, a wide range of the second region 19B has a higher concentration than the first region 19A, and thereby it becomes easier to obtain an expansion effect of a current path.

The impurity concentration in the second region 19B is not particularly limited, but is desirably $1.0 \times 10^{18}/cm^3$ to $1.0 \times 10^{20}/cm^3$. This is because it is possible to realize a good bulk resistance of the p-type semiconductor layer.

It is desirable that an electrical resistivity (specific resistance) in the second region 19B is smaller than an electrical resistivity in the first region 19A. For example, it is desirable that the electrical resistivity of the second region 19B is set to be 1/20 to 1/2 of the electrical resistivity of the first region 19A.

It is desirable that a width W2 of the second region 19B is set to be a size in which a hole can be sufficiently expanded in the second semiconductor layer 19. However, there is a limit on expansion of the hole, and even if the width W2 is increased to exceed the limit, a very large effect is not obtained. Rather, the increase in the width W2 exceeding the limit causes an increase in manufacturing cost. Therefore, the width W2 is desirably, for example, 0.1 µm to 3.0 µm.

Manufacturing Method

Figure 2:
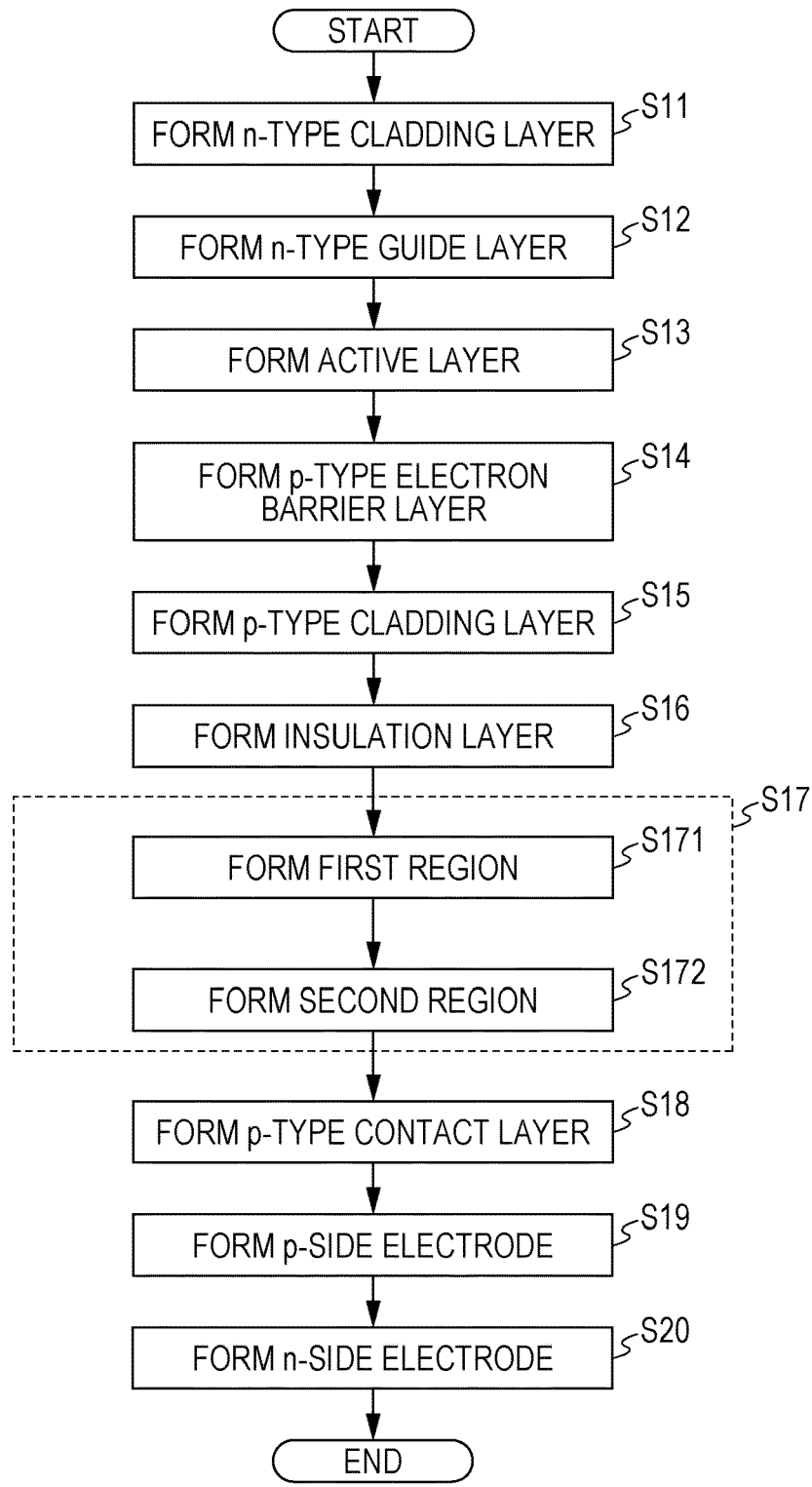
FIG. 2 is a flow diagram which describes a manufacturing method of the semiconductor light-emitting element shown in FIG. 1.

FIG. 2 shows a flow of a manufacturing method of the semiconductor light-emitting element 1 as described above. The semiconductor light-emitting element 1 can be manufactured as follows. That is, first, a substrate 12 made of, for example, GaN, is prepared. A buffer layer not shown is grown on a surface of the substrate 12 under a predetermined growth temperature (for example, 1050° C.) by, for example, a metal organic chemical vapor deposition (MOCVD) method. Thereafter, an n-type cladding layer 13 which is made of the material described above is grown on the substrate 12 (on the buffer layer) with a grown temperature maintained at, for example, 1050° C. by the MOCVD method (step S11). Subsequently, in the same manner, the n-type optical guide layer 14, the active layer 15, the p-type electron barrier layer 16, and the p-type cladding layer 17 are sequentially grown (steps S12 to S15). Accordingly, the first semiconductor layer 10 is formed on the substrate 12.

When performing the MOCVD, for example, trimethyl gallium (($CH_3)_3$Ga) is used as a source gas of gallium, for example, trimethyl aluminum (($CH_3)_3$Al) is used as a source gas of aluminum, and, for example, trimethyl indium (($CH_3)_3$In) is used as a source gas of indium, respectively. In addition, ammonia ($NH_3$) is used a source gas of nitrogen. Moreover, for example, monosilane ($SiH_4$) is used as a source gas of silicon, and, for example, bis(cyclopentadienyl) magnesium (($C_5H_5)_2$Mg) is used as a source gas of magnesium.

Subsequently, the insulation film 18 made of, for example, SiO2, is formed on the p-type cladding layer 17 (step S16). At this time, an opening H1 of a stripe shape is formed in the insulation film 18. A stripe direction (extending direction) of the opening H1 is set to be parallel to a (11-20) crystal surface.

Figure 3A:
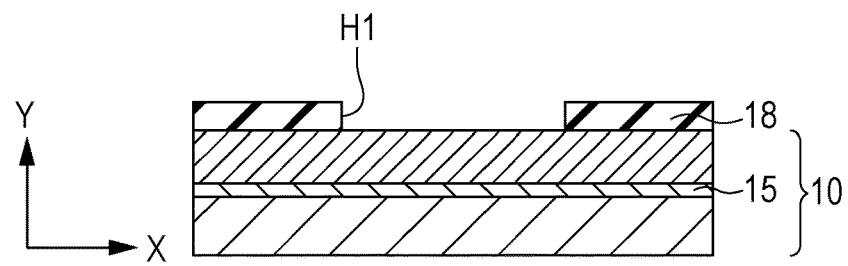
FIG. 3A is a schematic diagram which describes a formation process of a second semiconductor layer shown in FIG. 2.
Figure 3B:
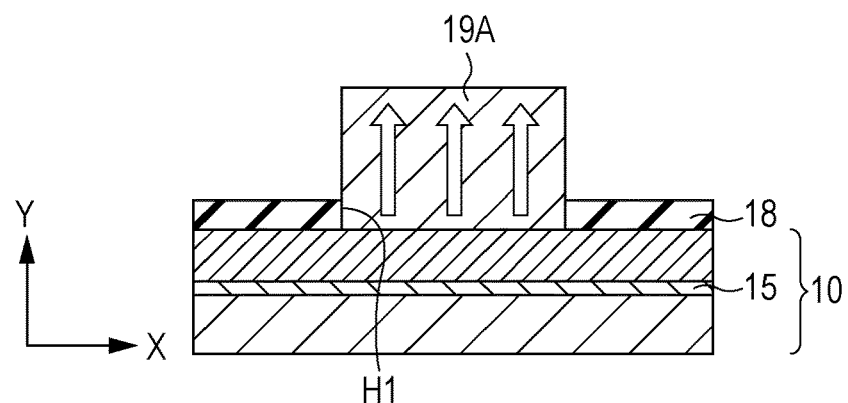
FIG. 3B is a schematic diagram which describes a process subsequent to FIG. 3A.
Figure 3C:
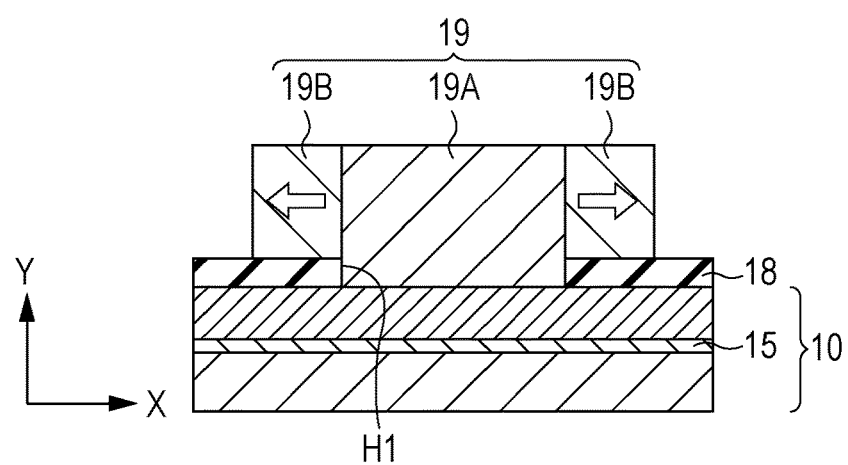
FIG. 3C is a schematic diagram which describes a process subsequent to FIG. 3B.

Then, the second semiconductor layer 19 is formed (step S17 FIGS. 3A to 3C). Specifically, as shown in FIGS. 3A and 3B, a growth temperature is set to, for example, 1000° C. by the MOCVD method to grow the p-type AlGaN. Accordingly, the first region 19A is formed to face a region exposed from the insulation film 18 on the first semiconductor layer 10, that is, the opening H1 of the insulation film 18 (step S171). Subsequently, as shown in FIG. 3C, the second region 19B is formed by setting the growth temperature to, for example, 1150° C., and growing the p-type AlGaN (step S172). At this time, the second region 19B is formed by a selective growth (lateral growth) so that crystal growth speed in a (11-20) direction (X direction in the figure) is faster than in a crystal orientation (0001) direction. As a condition of the selective growth, an appropriate condition may be set according to a material composition. However, for example, in a group III-V nitride semiconductor as described in the embodiment, a growth temperature is a parameter contributing to the selective growth. Moreover, in a crystal growth process of the second region 19B, crystal growth is performed by changing the first region 19A and a raw material ratio (composition ratio or impurity concentration (dope amount)). For example, a flow rate of a source gas of magnesium is increased more during a growth of the second region 19B than during a growth of the first region 19A. For this reason, as described above, it is possible to increase impurity concentration more in the second region 19B than in the first region 19A.

Then, the grown temperature is set to, for example, 1050° C. by, for example, the MOCVD method to grow the p-type contact layer 20 made of the material described above (step S18). Subsequently, the p-side electrode 21 is formed on the p-type contact layer 20 (step S19). On the other hand, the substrate 12 is, for example, wrapped and polished to have a predetermined thickness (for example, about 100 μm), and the n-side electrode 11 is formed on a rear surface of the substrate 12 (step S20). At last, the substrate 12 is arranged to have a predetermined size, and reflection mirror films which are not shown are formed on a pair of facing resonator end surfaces. Accordingly, the semiconductor light-emitting element 1 shown in FIG. 1 is completed.

Operation and Effect

In the semiconductor light-emitting element 1 of the embodiment, when a predetermined voltage is applied between the n-side electrode 11 and the p-side electrode 21, a constricted current in the opening H1 of the insulation film 18 is injected into the active layer 15. Accordingly, light-emission due to recombination of electrons and holes occurs, this light is reflected by the pair of reflector films which are not shown, and laser oscillation occurs at a wavelength at which a change in a phase during one reciprocation becomes an integer multiple of $2\pi$ to be emitted to the outside.

Figure 4A:
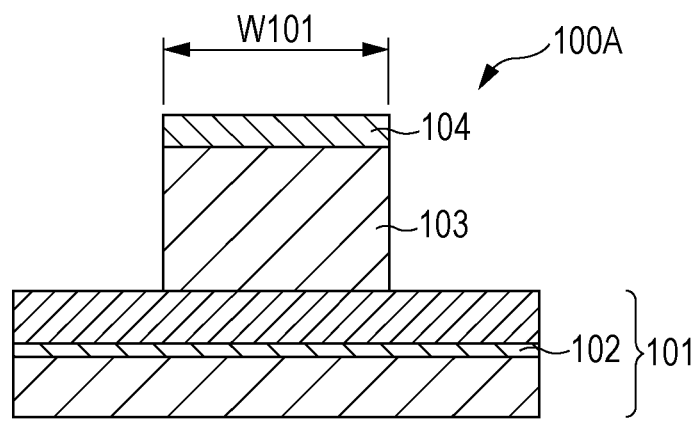
FIG. 4A is a schematic diagram which shows a configuration of a main portion of the semiconductor light-emitting element according to Comparative Example 1.
Figure 4B:
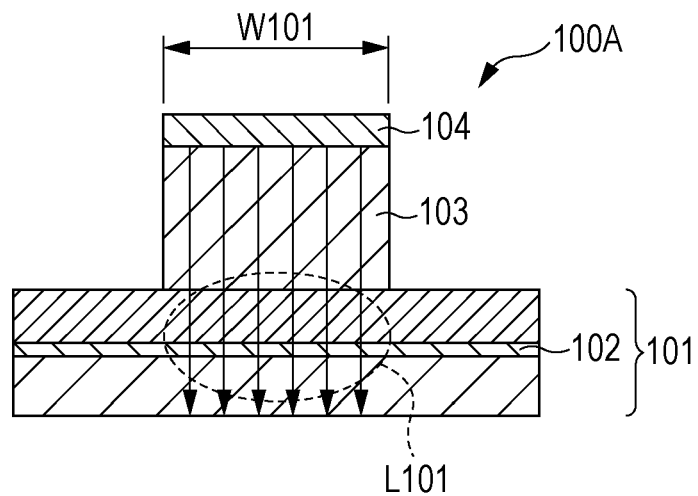
FIG. 4B is a schematic diagram which describes an operation of the semiconductor light-emitting element shown in FIG. 4A.

Here, FIGS. 4A and 4B show a configuration of a main portion and an operation of the semiconductor light-emitting element (semiconductor light-emitting element 100A) according to Comparative Example 1. In the semiconductor light-emitting element 100A, a second semiconductor layer 103 which configures a ridge portion is formed on a first semiconductor layer 101 which includes an active layer 102, and a p-side electrode 104 is formed on an upper surface of the second semiconductor layer 103. The second semiconductor layer 103 is formed on the first semiconductor layer 101 by a crystal growth, and is patterned to have a predetermined stripe width (W101) by, for example, etching. In the semiconductor light-emitting element 100A, as shown in FIG. 4B, it is possible to obtain a low threshold current density by current constriction. Moreover, it is possible to have a refractive index difference inside or outside the ridge portion by embedding the second semiconductor layer 103 (ridge portion) using an insulation material having a refractive index lower than a semiconductor, such that a so-called light transverse mode is easily controlled. However, in such a structure, a contact area between the p-side electrode 21 and the second semiconductor layer 103 is controlled to be the width W101 or less. Accordingly, an increase in a contact resistance with the p-side electrode 21 or a semiconductor bulk resistance is caused to increase a drive voltage.

Figure 5A:
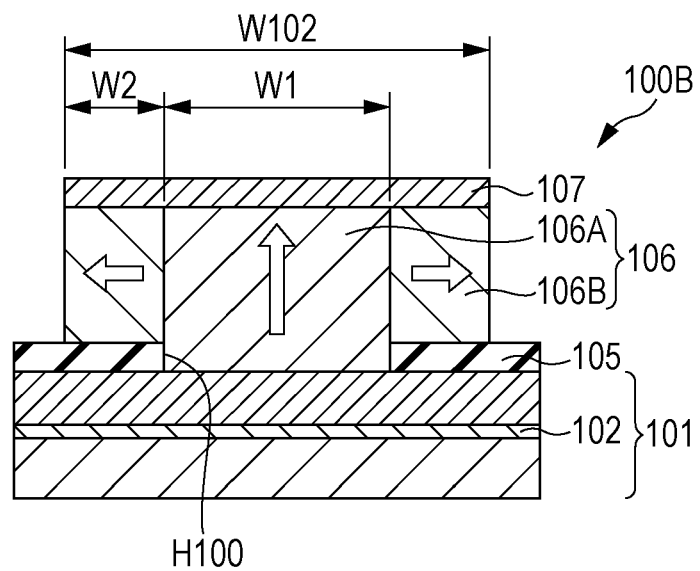
FIG. 5A is a schematic diagram which shows a configuration of a main portion of the semiconductor light-emitting element according to Comparative Example 2.
Figure 5B:
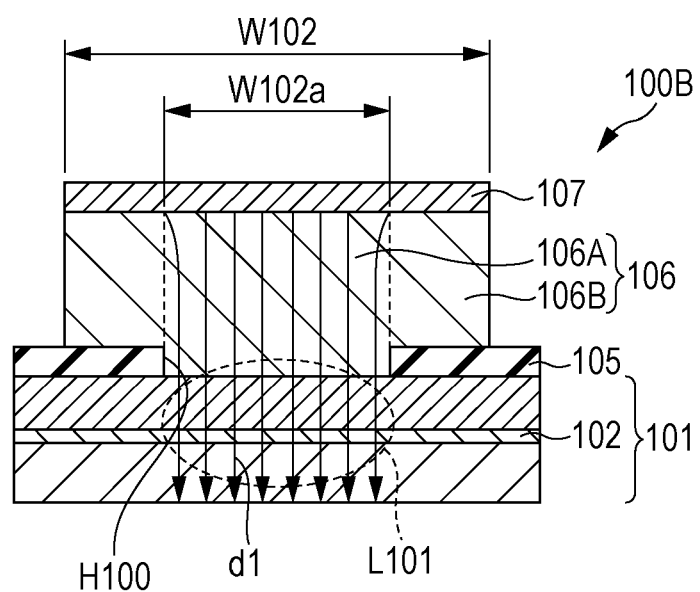
FIG. 5B is a schematic diagram which describes an operation of the semiconductor light-emitting element shown in FIG. 5A.

FIGS. 5A and 5B show a configuration of a main portion and an operation of the semiconductor light-emitting element (semiconductor light-emitting element 100B) according to Comparative Example 2. In the semiconductor light-emitting element 100B, a second semiconductor layer 106 (ridge portion) is formed on the first semiconductor layer 101 including the active layer 102 through the insulation film 105 having the opening H100, and a p-side electrode 107 is formed on an upper surface of the second semiconductor layer 106. The second semiconductor layer 106 is formed by the crystal growth through the opening H100 of the insulation film 105, performs the crystal growth on the first region 106A, and then performs a selective growth on the second region 106B in a transverse direction. However, an impurity concentration of the first region 106A is the same as an impurity concentration of the second region 106B in Comparative Example 2. Accordingly, a ridge can be formed without performing an etching. In addition, compared to Comparative Example 1, it is possible to ensure a large contact area between the p-side electrode 107 and the second semiconductor layer 106, and to reduce a drive voltage.

Here, an effective ridge width or a current path cross-sectional area is determined by a current expansion from a current constriction portion near the opening H1 to the p-side electrode 107 (in the second semiconductor layer 106). In the semiconductor light-emitting element 100B of Comparative Example 2, a hole is transported while being diffused in the second semiconductor layer 106 (ridge portion), but has low mobility. Thus, as shown in FIG. 5B, expansion of a current path d1 is insufficient in the second semiconductor layer 106. In particular, since an activation energy of a p-type impurity is large in a nitride-based semiconductor, it is difficult to obtain a sufficient carrier density, and resistance of the p-type semiconductor is easily increased. Therefore, it is difficult to obtain an expansion effect of the current path due to a carrier diffusion (hole diffusion) in the ridge. That is, since a hole which is multiple carriers in the p-type semiconductor is difficult to expand in the p-type semiconductor with a relatively high resistance, an effective ridge width (W102a) becomes significantly smaller than an actual width (W102) of the p-side electrode 107. Therefore, it is not possible to sufficiently reduce a drive voltage.

Figure 6A:
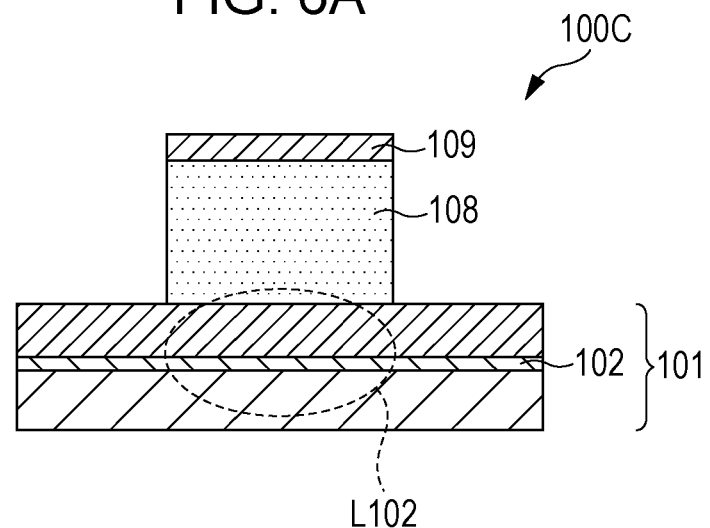
FIG. 6A is a schematic diagram which shows a configuration of a main portion of the semiconductor light-emitting element according to Comparative Example 3-1.
Figure 6B:
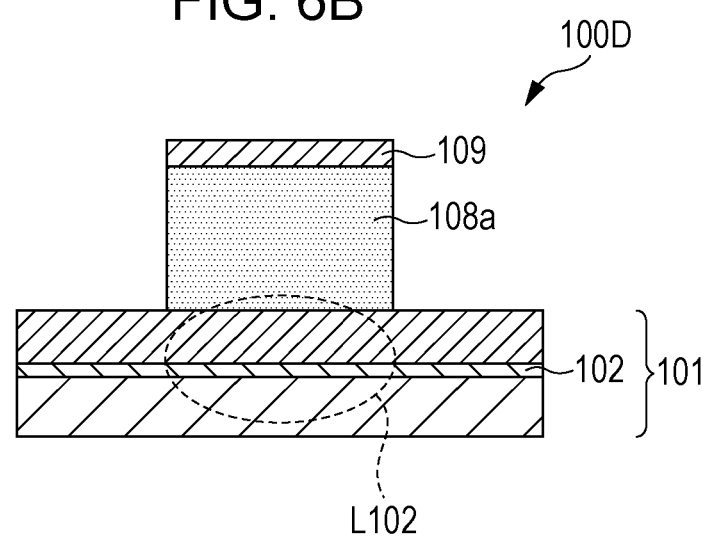
FIG. 6B is a schematic diagram which shows a configuration of a main portion of the semiconductor light-emitting element according to Comparative Example 3-2.

FIG. 6A shows a configuration of a main portion of the semiconductor light-emitting element (semiconductor light-emitting element 100C) according to Comparative Example 3-1. FIG. 6B shows a configuration of a main portion of the semiconductor light-emitting element (semiconductor light-emitting element 100D) according to Comparative Example 3-2. In a semiconductor device 100C shown in FIG. 6A, a second semiconductor layer 108 which configures a ridge portion is formed on the first semiconductor layer 101 including the active layer 102, and a p-side electrode 109 is formed on an upper surface of the second semiconductor layer 108. In a semiconductor device 100D shown in FIG. 6B, a second semiconductor layer 108a which configures the ridge portion is formed on the first semiconductor layer 101 including the active layer 102, and a p-side electrode 109 is formed on an upper surface of the second semiconductor layer 108a. The second semiconductor layer 108a of the semiconductor light-emitting element 100D has an impurity concentration higher than the second semiconductor layer 108 of the semiconductor light-emitting element 100C. As described in the semiconductor light-emitting element 100D of FIG. 6B, it is possible to lower a drive voltage by increasing an impurity concentration in the second semiconductor layer 108a. However, when the impurity concentration is increased, a light absorption characteristic is intensified. For this reason, a light L102 is absorbed into the second semiconductor layer 108a, and it is difficult to obtain a sufficient light output.

In contrast, in the embodiment, the second semiconductor layer 19 which configures a ridge portion includes the first region 19A facing the opening H1, and the second region 19B not facing the opening H1, and the second region 19B contains a portion which has a higher p-type impurity concentration than the first region 19A.

Figure 7:
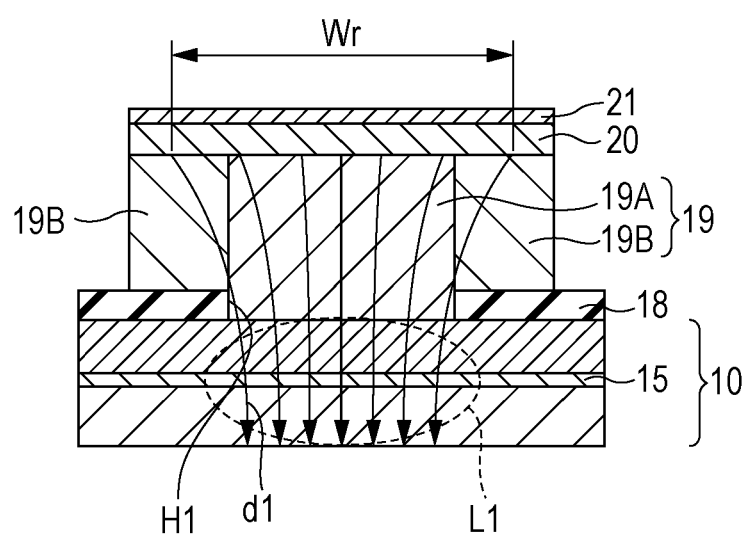
FIG. 7 is a schematic diagram which describes an operation of the semiconductor light-emitting element shown in FIG. 1.

Accordingly, a hole carrier density in the second region 19B of the second semiconductor layer 19 is higher than in the first region 19A, and an electrical resistivity of the second region 19B is lower than in the first region 19A. As a result, a hole of the second semiconductor layer 19 is drawn into the second region 19B with a relatively low resistance, and is efficiently diffused. Thus, a path (transport path) of carriers in the second semiconductor layer 19 is expanded, and a current path d is sufficiently expanded (FIG. 7). Accordingly, an effective ridge width Wr (an effective width of the p-side electrode 21) becomes sufficiently larger than an effective ridge width W102a of Comparative Example 2. Therefore, contact resistance with the p-side electrode 21 of the second semiconductor layer 19 is reduced. In addition, the p-type semiconductor bulk resistance is reduced by expansion of the current path d.

In the embodiment as described above, it is possible to expand a current path in the second semiconductor layer 19 which has a relatively high resistance while maintaining a current constriction effect by the insulation film 18 and light transverse mode controllability. Accordingly, it is possible to reduce a contact resistance with the p-side electrode 21 of the second semiconductor layer 19 and a bulk resistance. Therefore, it is possible to reduce a drive voltage while maintaining good properties.

EXAMPLE

A simulation as described below is performed on the semiconductor light-emitting element 1 of the embodiment. As a simulator, a simulator using Maxwell's equations, Poisson's equations, rate equations, or the like can be used.

In addition, as a simulation model, a simulation model which interposes a quantum well layer (In elemental ratio: 15%, thickness: 5 nm) made of GaInN using a barrier layer (In elemental ratio: 4%) made of GaInN, and has an active layer 15 which sets the number of quantum well layers to be three layers is used. A light emission wavelength of a nitride-based semiconductor laser including the active layer 15 is about 450 nm. Furthermore, the active layer 15 is interposed by the n-type cladding layer 13 and the p-type cladding layer 17 to be driven as a semiconductor laser. In addition, a width of the opening H1 of the insulation film 18 made of $SiO_2$ is set to be 1.5 μm to form a p-type AlGaN cladding layer (Al composition ratio: 5%, p-type impurity concentration $3.0 \times 10^{18}/cm^3$, thickness: 500 nm) as the first region 19A of the second semiconductor layer 19. Moreover, a p-type AlGaN cladding layer (Al composition ratio: 5%, p-type impurity concentration: $3.0 \times 10^{19}/cm^3$, thickness: 500 nm, width W2: 1.0 μm) is formed as the second region 19B.

Figure 8:
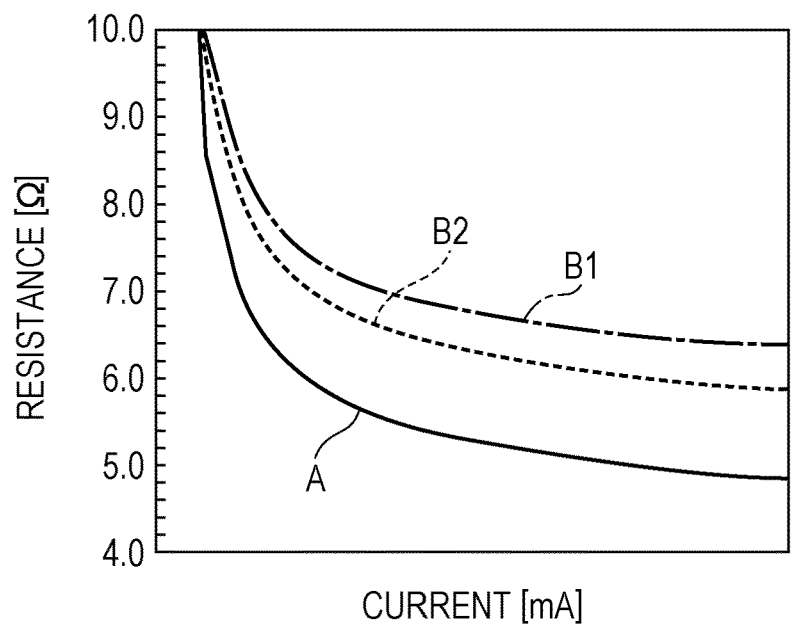
FIG. 8 is a characteristic diagram which shows a relationship between element differential resistance and a current value.
Figure 9:
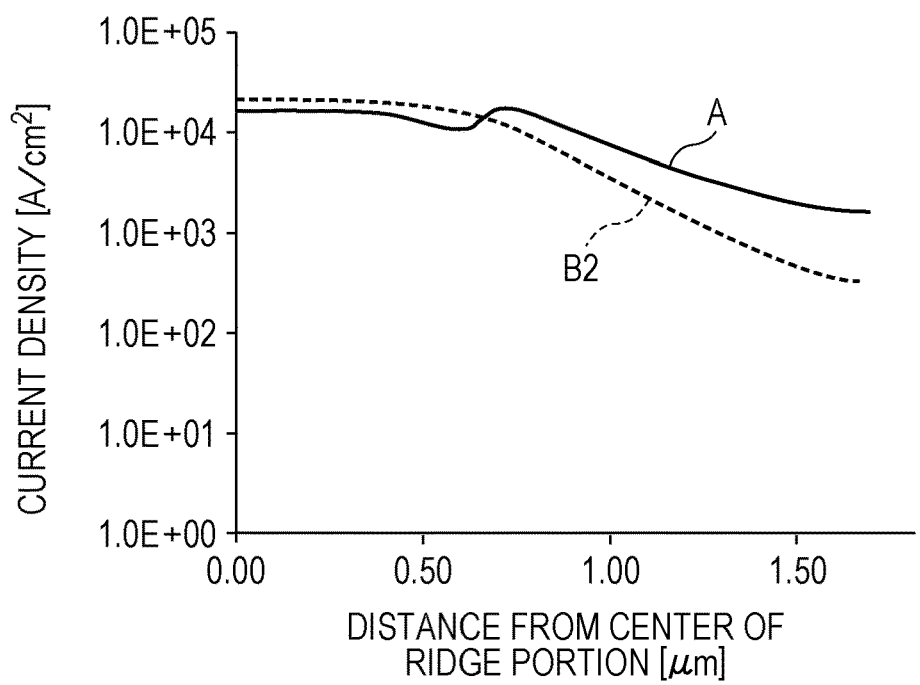
FIG. 9 is a characteristic diagram which shows a relationship between a current density and a distance from the center of a ridge portion.

FIGS. 8 and 9 show a simulation result which is obtained by using a simulation model (referred to as model A) which corresponds to the semiconductor light-emitting element 1 of the embodiment as described above. FIG. 8 shows a relationship of an element differential resistance with respect to a current value, and FIG. 9 shows a relationship of a current density with respect to a distance from the center of a ridge portion. This represents a current density distribution in a plane parallel to the substrate 12 in the second semiconductor layer 19.

In addition, FIG. 8 also shows a simulation result which is obtained by using a simulation model (referred to as models B1 and B2) corresponding to each of Comparative Examples 1 and 2 described above. Moreover, FIG. 9 shows a simulation result which is obtained by using a model B2 corresponding to Comparative Example 2.

In the model B1 corresponding to Comparative Example 1, in a configuration shown in FIG. 4A, a p-type AlGaN cladding layer (Al composition: 5%, p-type impurity concentration: $3.0 \times 10^{18}/cm^3$, thickness: 500 nm) is formed as the second semiconductor layer 103. Structures other than the second semiconductor layer 103 are the same as in the model A.

In the model B2 corresponding to Comparative Example 2, in a configuration shown in FIG. 5A, a p-type AlGaN cladding layer (Al composition: 5%, p-type impurity concentration: $3.0 \times 10^{18}/cm^3$, thickness: 500 nm) is formed as the second semiconductor layer 106. An impurity concentration of the first region 106A is the same as an impurity concentration of the second region 106B to be ($3.0 \times 10^{18}/cm^3$). In addition, a width W102 of the second semiconductor layer 106 is larger than a width of the opening H100, and a width W2 of the second region 106B is set to be 1.0 μm.

Structures other than the second semiconductor layer 106 are the same as in the model A.

As a result of simulation which is obtained by using these models A, B1, and B2, as shown in FIG. 8, a resistance value of model A having the second region 19B with a high impurity concentration becomes smaller than in models B1 and B2. In addition, even if a resistance value in the model B2 is smaller than in the model B1, its effect is smaller than the model A. In addition, as shown in FIG. 9, current density distribution in the ridge portion is uniform in model A compared to model B2. This shows that a current path is expanded more extensively by the second region 19B which has a high impurity concentration in model A. In addition, it is considered that an effect that a resistance value shown in FIG. 8 is significantly reduced is obtained by the expansion of the current path. In this manner, in the semiconductor light-emitting element 1 of the embodiment, it is checked that an element differential resistance can be significantly reduced compared to element structures of Comparative Examples 1 and 2.

Figure 10:
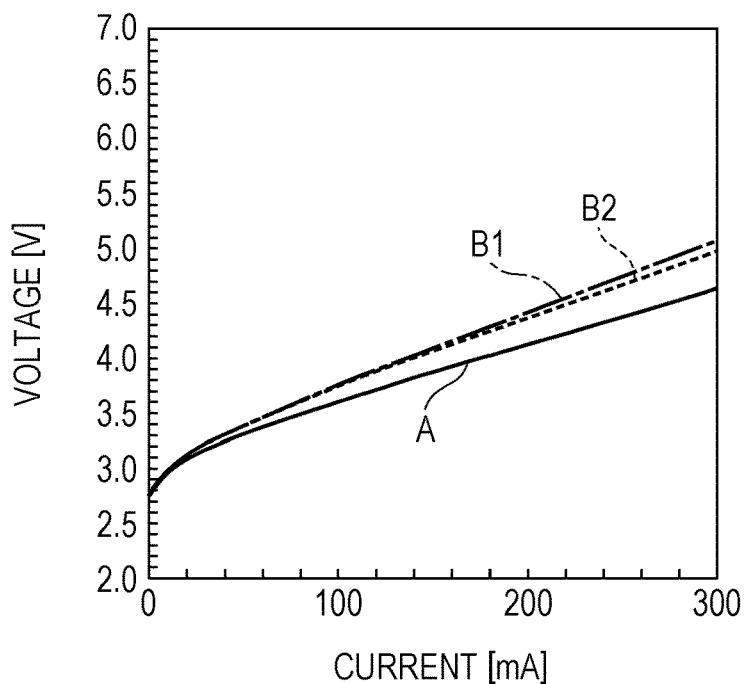
FIG. 10 is a characteristic diagram which shows a relationship (V-I characteristics) of a voltage and a current.
Figure 11:
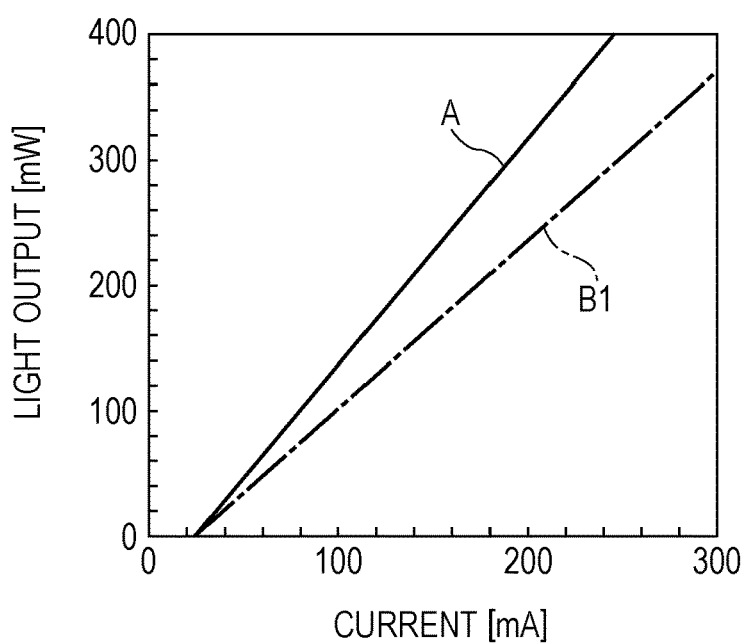
FIG. 11 is a characteristic diagram which shows a relationship between a light output (L-I characteristics) and a current.

In addition, a relationship (V-I characteristics) of a voltage with respect to a current in models A, B1, and B2 is shown in FIG. 10, and a relationship (L-I characteristics) of a light output with respect to a current in models A and B1 is shown in FIG. 11, respectively. In this manner, the V-I characteristics and the L-I characteristics in model A are improved compared to in models B1 and B2, and it is found that good laser characteristics are obtained.

Figure 12A:
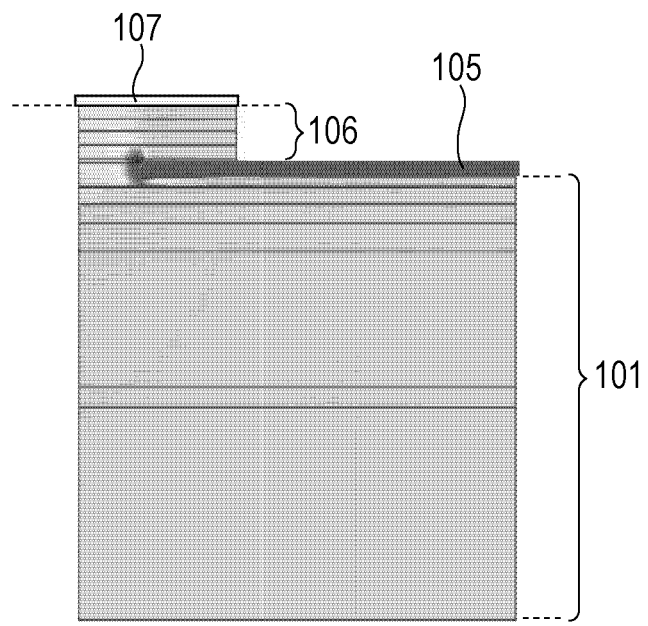
FIG. 12A shows a current density distribution of a model shown in FIG. 5A.
Figure 12B:
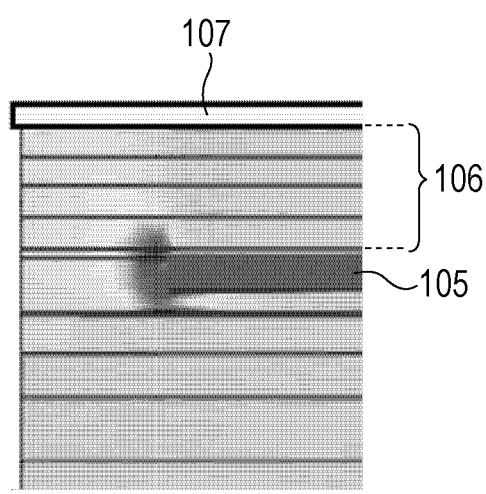
FIG. 12B is an enlarged diagram of a portion of FIG. 12A.
Figure 13A:
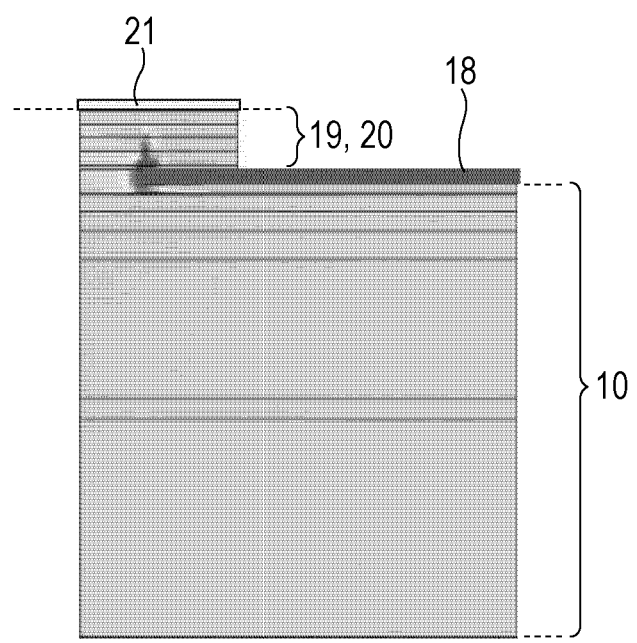
FIG. 13A shows a current density distribution of a model shown in FIG. 1.
Figure 13B:
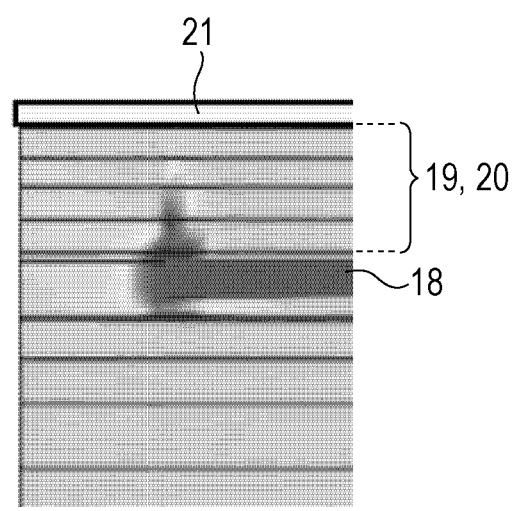
FIG. 13B is an enlarged portion of a portion of FIG. 13A.

Furthermore, a simulation result for a current density distribution of model B2 corresponding to Comparative Example 2 is shown in FIGS. 12A and 12B. FIG. 12B is an enlarged diagram of a vicinity of the insulation film 105 of FIG. 12A. A simulation result for a current density distribution of model A corresponding to the embodiment is shown in FIGS. 13A and 13B. FIG. 13B is an enlarged diagram of a vicinity of the insulation film 18 of FIG. 13A. In these figures, a portion is shown so as to be closer to black as a current density becomes higher, and to be closer to white as the current density becomes lower. Compared to model B2, it is found that the current density is increased in the vicinity of a selective growth interface in model A. This shows that a carrier expands more extensively in model A.

Hereinafter, modification examples of the semiconductor light-emitting element of the embodiment will be described. The same numerals are given to the same configuration elements as in the embodiment described above to appropriately omit a description.

Modification Example 1

Figure 14:
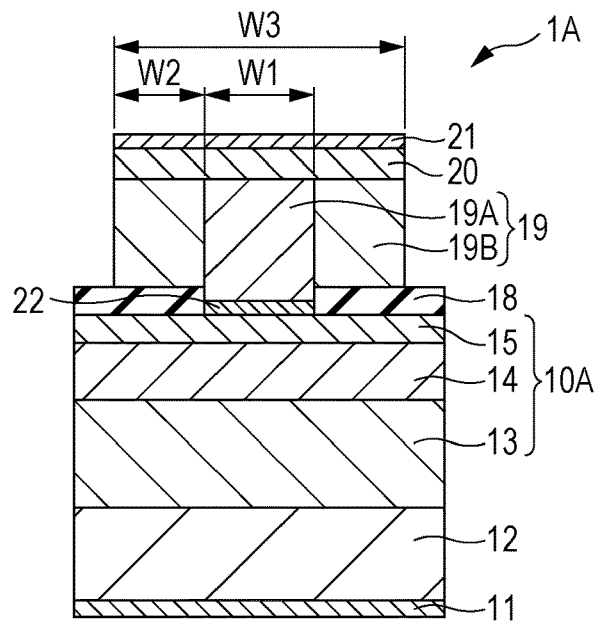
FIG. 14 is a cross-sectional view which shows a configuration of the semiconductor light-emitting element according to Modification Example 1.

FIG. 14 shows a configuration of the semiconductor light-emitting element (semiconductor light-emitting element 1A) according to Modification Example 1. In the semiconductor light-emitting element 1 of the embodiment, a case in which the first semiconductor layer 10 formed on a layer lower than the insulation film 18 is made of the n-type cladding layer 13, the n-type optical guide layer 14, the active layer 15, the p-type electron barrier layer 16, and the p-type cladding layer 17 is exemplified, but a configuration of the first semiconductor layer 10 is not limited thereto. As described in the modification example, the insulation film 18 may be formed on a first semiconductor layer 10A made of the n-type cladding layer 13, the n-type optical guide layer 14, and the active layer 15. In this case, the p-type electron barrier layer 22 is formed in the opening H1 of the insulation film 18, and the second semiconductor layer 19 including the first region 19A and the second region 19B is formed thereon. That is, a laminated structure of the first semiconductor layer 10A is not limited to the structure described above, but may include a p-type or an n-type (herein, n-type) semiconductor layer. The p-type electron barrier layer 22 is made of, for example, $Al_{0.20}Ga_{0.80}N$, and is doped with, for example, magnesium (Mg) as a p-type impurity. A thickness of the p-type electron barrier layer 16 is, for example, 10 nm, and is formed at the same width as, for example, the opening H1.

As described in the modification example, the insulation film 18 may be formed on the first semiconductor layer 10A made of the n-type semiconductor layer (the n-type cladding layer 13, the n-type optical guide layer 14, and the active layer 15). Even in this case, it is possible to obtain the same effect as in the embodiment. In addition, for example, since a surface of the n-type semiconductor has a high flatness, the insulation film 18 having the opening H1 is formed easier than in the embodiment.

Modification Example 2

Figure 15:
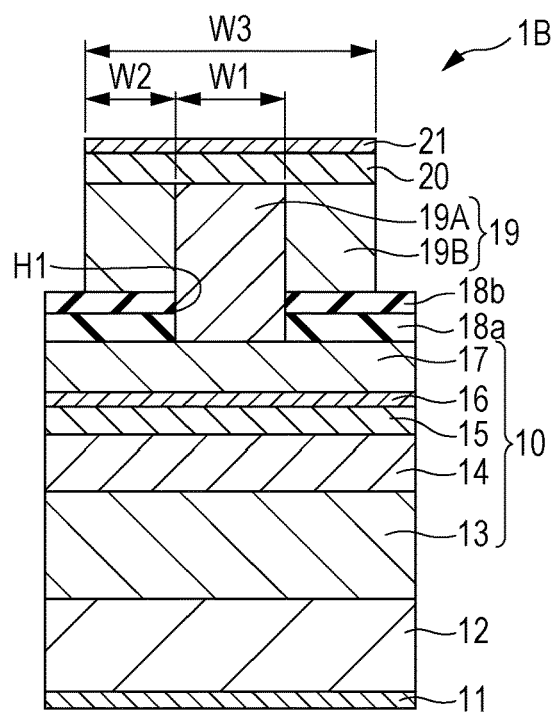
FIG. 15 is a cross-sectional view which shows a configuration of the semiconductor light-emitting element according to Modification Example 2.

FIG. 15 shows a configuration of the semiconductor light-emitting element (semiconductor light-emitting element 1B) according to Modification Example 2. In the modification example, the insulation film having the opening H1 is configured to have a laminated film of a first insulation film 18a and a second insulation film 18b. In this manner, an insulation film of two or more layers may be laminated on the first semiconductor layer 10. A configuration material of the first insulation film 18a and the second insulation film 18b is not particularly limited; however, for example, the first insulation film 18a is configured from $SiO_2$ and the second insulation film 18b is configured from SiN. A thickness of the first insulation film 18a and a thickness of the second insulation film 18b may be the same as or different from each other, but are, for example, 100 nm, respectively.

As described in the modification example, the laminated film made of the first insulation film 18a and the second insulation film 18b may be formed on the first semiconductor layer 10A, and even in this case, it is possible to obtain the same effect as in the embodiment described above. In addition, it is possible to further increase optical mode controllability by selecting a combination of a refractive index and an absorption coefficient of each of the first insulation film 18a and the second insulation film 18b.

Modification Example 3

Figure 16:
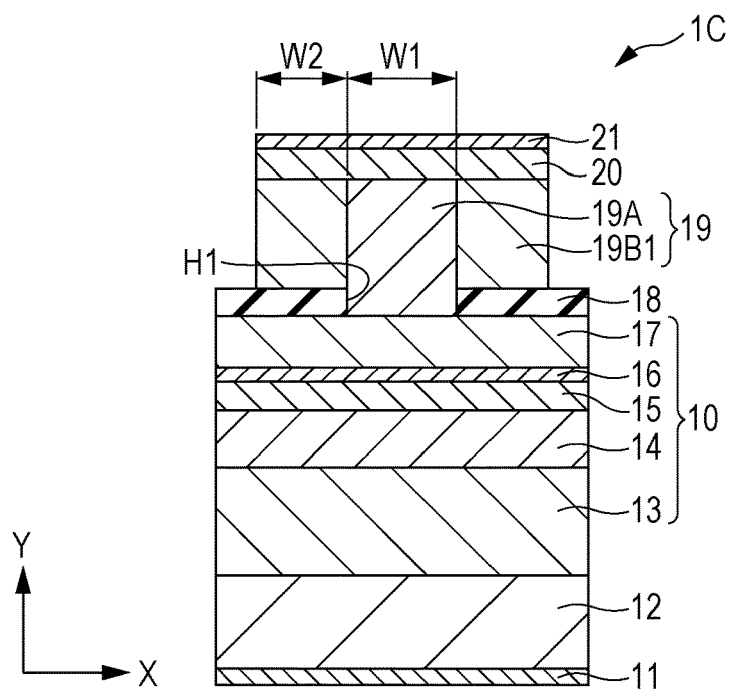
FIG. 16 is a cross-sectional view which shows a configuration of the semiconductor light-emitting element according to Modification Example 3.

FIG. 16 shows a configuration of the semiconductor light-emitting element (semiconductor light-emitting element 1C) according to Modification Example 3. In the modification example, a second region (second region 19B1) of the second semiconductor layer 19 has the same configuration as the semiconductor light-emitting element 1 of the embodiment except for spatially having an impurity concentration gradient (concentration distribution). In the second region 19B1, an impurity concentration is not limited to a case of being uniform, but may have a concentration gradient in an X direction or a Y direction. That is, in the second region 19B1, growth conditions such as a raw material ratio or temperature may be intentionally changed to be formed, or an unintentional concentration change may also occur. As described above, the second region 19B may even include a portion which has a higher impurity concentration than the first region 19A, and the second region 19B may have an intentional or an unintentional concentration gradient as described in the modification example. For example, the second region 19B1 may have a distribution in which the impurity concentration is gradually increased from a side of the insulation film 18 to a side of the p-side electrode 21.

As described in the modification example, even when the second region 19B has the concentration gradient, it is possible to obtain the same effect as in the embodiment described above. In addition, it is possible to perform a design to reduce a light absorption loss due to an impurity by adjusting the impurity concentration of the second region 19B1. For example, it is possible to suppress the light absorption loss due to an impurity by forming a distribution which allows the impurity concentration to be gradually increased from the side of the insulation film 18 to the side of the p-side electrode 21 in the second region 19B1.

Modification Example 4

Figure 17:
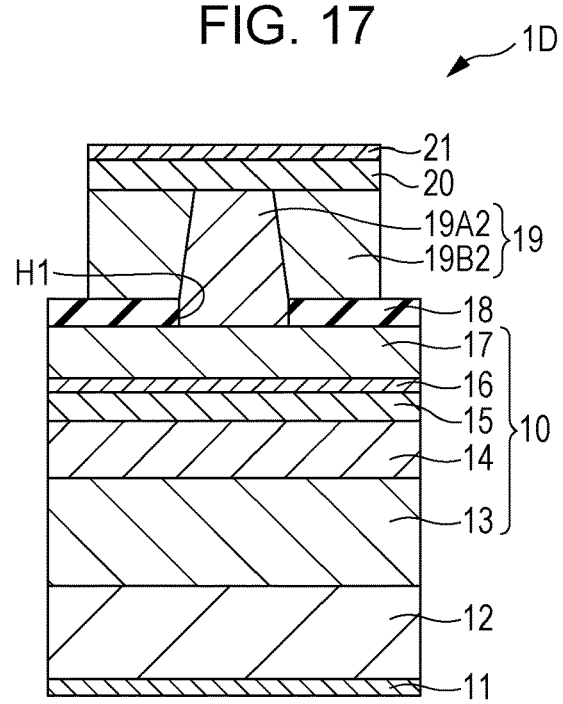
FIG. 17 is a cross-sectional view which shows a configuration of the semiconductor light-emitting element according to Modification Example 4.

FIG. 17 shows a configuration of the semiconductor light-emitting element (semiconductor light-emitting element 1D) according to Modification Example 4. In the modification example, an interface between the first region (first region 19A2) and a second region (second region 19B2) is tapered in the second semiconductor layer 19. Specifically, a side surface of the first region 19A2 has a crystal orientation surface other than a (11-20) surface, for example, a (11-22) surface. In the modification example, the second region 19B2 also has a portion which has a higher impurity concentration than the first region 19A2.

As described in the modification example, the side surface of the first region 19A2 may be a crystal orientation surface other than the (11-20) surface, and in this case, it is also possible to obtain the same effect as in the embodiment. In addition, it is possible to increase an average value of the impurity concentration in the second semiconductor layer 19, which is more advantageous for driving at a low voltage.

Modification Example 5

Figure 18:
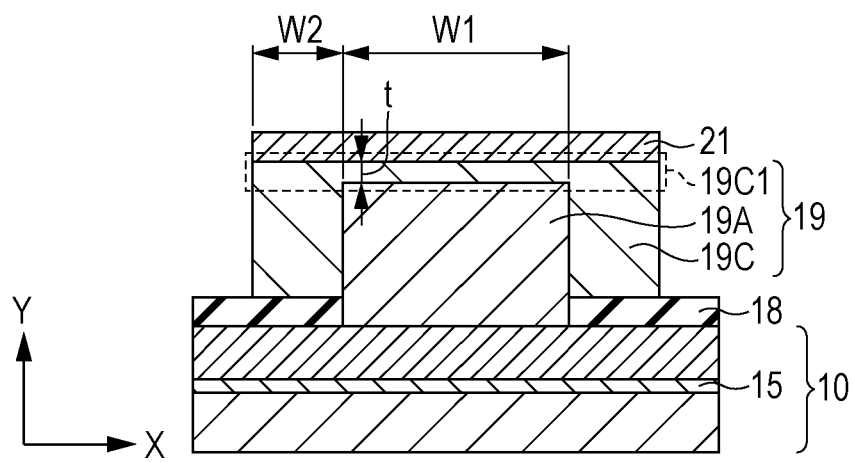
FIG. 18 is a cross-sectional view which shows a configuration of the semiconductor light-emitting element according to Modification Example 5.

FIG. 18 shows a configuration of a main portion of the semiconductor light-emitting element according to Modification Example 5. In the modification example, a second region (second region 19C) with higher impurity concentration than the first region 19A is also formed on a side surface of the p-side electrode 21 in the second semiconductor layer 19. In other words, the second region 19C is formed to cover a side surface and an upper surface of the first region 19A. A portion (third region 19C1) facing the p-side electrode 21 of the second region 19C functions as a p-type contact layer. A thickness t of the third region 19C1 is smaller than a width W2 of the second region 19C. Like the second region 19B of the embodiment, the second region 19C is formed by selective growth after forming the first region 19A. During the selective growth, not only a crystal growth in the X direction, but also a crystal growth slightly in the Y direction proceeds due to the conditions. Since the third region 19C1 formed in a selective growth process of the second region 19C has a higher concentration than the first region 19A, the third region can function as a contact layer. However, since the p-type contact layer 20 of the embodiment is not additionally formed in the modification example, it is desirable that an impurity concentration of the second region 19C is set to be $1.0 \times 10^{18}/cm^3$ to $1.0 \times 10^{21}/cm^3$.

Modification Example 6

Figure 19:
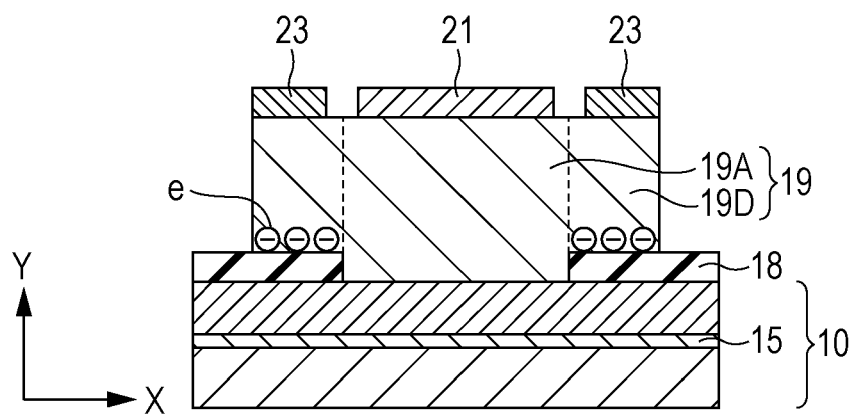
FIG. 19 is a cross-sectional view which shows a configuration of the semiconductor light-emitting element according to Modification Example 6.

FIG. 19 shows a configuration of a main portion of the semiconductor light-emitting element according to Modification Example 6. In the embodiment described above, a current path is expanded by increasing an impurity concentration of the second region 19B and the like in the second semiconductor layer 19; however, a configuration to expand the current path is not limited thereto. For example, as described in the modification example, the current path may be configured so as to be expanded by providing a current path control electrode (electrode 23) separately (electrically isolated) from the p-side electrode 21, and expanding a transport path of carriers using the electrode 23. The electrode 23 is provided to correspond to, for example, the second region 19B. That is, the semiconductor light-emitting element of the embodiment of the disclosure may include any current path expansion unit. The current path expansion unit may be an impurity contained in the first region 19A and the second region 19B at different concentrations described in the embodiments and the like, or may be a configuration including the electrode 23 as described in the modification example. In the modification example, it is possible to cause a negative fixed charge e on a surface of the insulation film 18 by applying a predetermined electrode to the second region 19D through the electrode 23, and to draw a hole carrier to the second region 19D side. In the modification example, impurity concentrations of the first region 19A and the second region 19D may be the same as or different from each other.

As described above, description is provided with the embodiments and modification examples; however, the disclosure is not limited to these embodiments, and various modifications can be made. For example, a configuration of each layer and a lamination sequence of the n-type semiconductor layer, the active layer, and the p-type semiconductor layer described above are not particularly limited. In addition, it is not necessary to include all of the layers described above, or other layers may be also included. For example, a p-type optical guide layer may be further included between the p-type cladding layer 17 and the p-type electron barrier layer 16. The semiconductor light-emitting element of the disclosure may have a laminated structure having an active layer between an n-type semiconductor layer and a p-type semiconductor layer. In addition, the active layer may be an n type or a p type.

In addition, each configuration of the first semiconductor layer 10 provided on a lower layer than the insulation film 18, and the second semiconductor layer 19 provided on a more upper layer than the insulation film 18 is not limited to the configuration described above. For example, the first semiconductor layer 10 is obtained by laminating the n-type cladding layer 13, the n-type optical guide layer 14, the active layer 15, and the p-type electron barrier layer 16, and the insulation film 18 may be formed on the p-type electron barrier layer 16.

Furthermore, in the embodiment and the like, it is exemplified that the p-side electrode 21 is formed almost over an entire upper surface of the second semiconductor layer 19, but the embodiment is not limited to the configuration. The p-side electrode 21 may be formed at a portion of the upper surface of the second semiconductor layer 19. The p-side electrode 21 may be electrically connected to the second semiconductor layer 19. In the same manner, the n-side electrode 11 may be electrically connected to the first semiconductor layer 10, and does not necessarily have to be formed on a surface of the substrate 12.

Furthermore, a ridge portion of the semiconductor light-emitting element described in the embodiment and the like may be embedded by a material such as other semiconductors, dielectrics, metals, and resins. In addition, an element upper surface may not necessarily be in a convex shape, but may be flat or in a concave shape.

Moreover, a crystal which configures the second semiconductor layer 19 does not have to be a single crystal, but may be, for example, a polycrystal or an amorphous crystal.

Furthermore, a semiconductor which configures the second semiconductor layer 19 is not limited to a nitride-based compound semiconductor described above, but may be another compound semiconductor. Moreover, in addition to this, the semiconductor may be an oxide semiconductor such as oxide indium gallium zinc (InGaZnO, IGZO) or zinc oxide (ZnO). Alternatively, the semiconductor may be, for example, amorphous or polycrystalline silicon. The semiconductor device of the disclosure is, of course, applicable to a semiconductor laser or LED, but in addition to this, is also applicable to all types of semiconductor devices which are obtained by laminating a semiconductor layer that exhibits conductivity by impurity diffusion through an insulation film.

Effects described in the present embodiment and the like are no more than an exemplification, and there may be effects other than the effects described herein, and other effects may be further included.

The present disclosure can also adopt the following configuration.

(1)

A semiconductor light-emitting element includes a laminated structure which has an active layer between a first conductivity-type semiconductor layer and a second conductivity-type semiconductor layer, a first semiconductor layer which includes at least the first conductivity-type semiconductor layer of the laminated structure, an insulation film which is formed on the first semiconductor layer and has an opening, and a second semiconductor layer which is formed on the insulation film and includes at least the second conductivity-type semiconductor layer of the laminated structure, in which the second semiconductor layer includes a first region facing the opening of the insulation film and a second region not facing the opening, and the second region has a portion with a higher impurity concentration than the first region.

(2)

The semiconductor light-emitting element described in (1) further includes a first electrode which is electrically connected to the first semiconductor layer of the laminated structure, and a second electrode which is electrically connected to the second semiconductor layer of the laminated structure.

(3)

The semiconductor light-emitting element described in (2) in which the second electrode is formed on the second semiconductor layer and the semiconductor light-emitting element further includes a second conductivity-type contact layer between the second semiconductor layer and the second electrode.

(4)

The semiconductor light-emitting element described in (2) or (3), in which the second electrode is formed on the second semiconductor layer, and the second semiconductor layer includes a third region which has a higher impurity concentration than the first region on a side surface on the second electrode.

(5)

The semiconductor light-emitting element described in (4), in which a thickness of the third region is smaller than a width of the second region.

(6)

The semiconductor light-emitting element described in any one of (2) to (5), in which the second electrode is formed on the second semiconductor layer, and a contact area between the second semiconductor layer and the second electrode is larger than an opening area of the insulation film.

(7)

The semiconductor light-emitting element described in (6), in which the second region of the second semiconductor layer is formed to be adjacent to at least a portion of a side surface of the first region.

(8)

The semiconductor light-emitting element described in (7), in which the second region is formed, across which the first region is interposed.

(9)

The semiconductor light-emitting element described in any one of (1) to (8), in which a width of the second region is from 0.1 µm to 3.0 µm.

(10)

The semiconductor light-emitting element described in any one of (1) to (9), in which the second region includes a portion which has an impurity concentration twice to 20 times higher than the first region.

(11)

The semiconductor light-emitting element described in any one of (1) to (10), in which the second region includes a portion which has an impurity concentration of $1.0\times10^{18}/\text{cm}^3$ to $1.0\times10^{20}/\text{cm}^3$.

(12)

The semiconductor light-emitting element described in any one of (1) to (11), in which an electrical resistivity of the second region is smaller than an electrical resistivity of the first region.

(13)

The semiconductor light-emitting element described in (12), in which the electrical resistivity of the second region is 1/20 to 1/2 of the electrical resistivity of the first region.

(14)

The semiconductor light-emitting element described in any one of (1) to (13), in which the second semiconductor layer is configured to have a compound semiconductor containing nitrogen (N) and at least one element of gallium (Ga), aluminum (Al), indium (In), and boron (B).

(15)

A semiconductor light-emitting element includes a laminated structure which has an active layer between a first conductivity-type semiconductor layer and a second conductivity-type semiconductor layer, a first semiconductor layer which includes at least the first conductivity-type semiconductor layer of the laminated structure, an insulation film which is formed on the first semiconductor layer and has an opening, and a second semiconductor layer which is formed on the insulation film and includes at least the second conductivity-type semiconductor layer of the laminated structure, in which the second semiconductor layer includes a first region facing the opening of the insulation film and a second region not facing the opening, and the second region has a smaller electrical resistivity than the first region.

(16)

The semiconductor light-emitting element described in (15), in which an electrical resistivity of the second region is 1/20 to 1/2 of an electrical resistivity of the first region.

(17)

A semiconductor light-emitting element includes a laminated structure which has an active layer between a first conductivity-type semiconductor layer and a second conductivity-type semiconductor layer, a first semiconductor layer which includes at least the first conductivity-type semiconductor layer of the laminated structure, an insulation film which is formed on the first semiconductor layer and has an opening, and a second semiconductor layer which is formed on the insulation film and includes at least the second conductivity-type semiconductor layer of the laminated structure, in which the second semiconductor layer includes a first region facing the opening of the insulation film and a second region not facing the opening, and a path of carriers in the second semiconductor layer is configured so as to be expanded more than a width of the opening of the insulation film.

(18)

The semiconductor light-emitting element described in (17) further includes a current path expansion unit which expands a path of the carriers in the second semiconductor layer.

(19)

The semiconductor light-emitting element described in (18), in which the current path expansion unit is one of a plurality of electrodes each provided to correspond to one of the first region and the second region, and impurities contained in the first region and the second region at different concentrations.

(20)

A method of manufacturing a semiconductor light-emitting element includes forming a first semiconductor layer which includes at least a first conductivity-type semiconductor layer of a laminated structure that has an active layer between the first conductivity-type semiconductor layer and a second conductivity-type semiconductor layer, forming an insulation film which has an opening on the first semiconductor layer, and forming a second semiconductor layer which includes at least the second conductivity-type semiconductor layer of the laminated structure on the insulation film, in which, in the forming of the second semiconductor layer, a first region facing an opening of the insulation film is formed, and a second region not facing the opening is formed by selective growth after forming the first region.

(21)

The method of manufacturing a semiconductor light-emitting element described in (20), in which the second region includes a portion which has a higher impurity concentration than the first region.

(22)

The method of manufacturing a semiconductor light-emitting element described in (20) or (21), in which a raw material ratio when forming the first region and a raw material ratio when forming the second region are different from each other in the forming of the second semiconductor layer.

(23)

The method of manufacturing a semiconductor light-emitting element described in (22), in which, in the forming of the second semiconductor layer, each of the first region and the second region grows while a source gas including an impurity thereto is supplied, and a supply amount of the source gas when forming the second region is set to be more than when forming the first region.

(24)

The method of manufacturing a semiconductor light-emitting element described in (20), in which, in the forming of the second semiconductor layer, the first region and the second region are formed by different growth conditions.

(25)

The method of manufacturing a semiconductor light-emitting element described in (24), in which the first region and the second region are formed by different growth temperatures.

(26)

A semiconductor device includes a first semiconductor layer, an insulation film which is formed on the first semiconductor layer and has an opening, and a second semiconductor layer which is formed on the insulation film, in which the second semiconductor layer includes a first region facing the opening of the insulation film, and a second region not facing the opening, and the second region has a portion with a higher impurity concentration than the first region or has a smaller electrical resistivity than the first region.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor light-emitting element comprising:
    an active layer between a first semiconductor layer of first conductivity-type and a compound semiconductor layer of a second conductivity-type, the second conductivity-type is opposite to the first conductivity-type;
    an insulation film between the compound semiconductor layer and a second semiconductor layer of the second conductivity-type, a first region of the second semiconductor layer is adjacent a second region of the second semiconductor layer in a cross-sectional view of the semiconductor light-emitting element,
    wherein the second semiconductor layer is between the insulation film and a contact layer of the second conductivity-type, the contact layer is in direct physical contact with the first region at a boundary between the first region and the contact layer,
    wherein the first region extends into an opening in the insulation film to a boundary between the compound semiconductor layer and the first region, the insulation film surrounds the opening in the cross-sectional view,
    wherein a first boundary portion of the first region is at the boundary between the compound semiconductor layer and the first region, a concentration for an impurity of the second conductivity-type in the second region is higher than a concentration for an impurity of the second conductivity-type in the first boundary portion of the first region, and
    wherein a second boundary portion of the first region is at the boundary between the first region and the contact layer, the concentration for an impurity of the second conductivity-type in the second region is higher than a concentration for an impurity of the second conductivity-type in the second boundary portion of the first region.

2. The semiconductor light-emitting element according to claim 1, wherein the first boundary portion of the first region is in direct physical contact with the compound semiconductor layer.

3. The semiconductor light-emitting element according to claim 1, wherein the active layer is a quantum well layer.

4. The semiconductor light-emitting element according to claim 1, wherein the insulation film comprises a silicon oxide.

5. The semiconductor light-emitting element according to claim 1, wherein the insulation film is in direct physical contact with the compound semiconductor layer and the second region.

6. The semiconductor light-emitting element according to claim 1, wherein the insulation film is between the compound semiconductor layer and the second region in a manner that prevents the second region from being in direct physical contact with the compound semiconductor layer.

7. The semiconductor light-emitting element according to claim 1, wherein the compound semiconductor layer is between the first semiconductor layer and the insulation film.

8. The semiconductor light-emitting element according to claim 1, wherein the second region surrounds the first region in the cross-sectional view.

9. The semiconductor light-emitting element according to claim 1, wherein the second region has a smaller electrical resistivity than the first region.

10. The semiconductor light-emitting element according to claim 1, wherein the first region is in direct physical contact with the compound semiconductor layer and the contact layer.

11. The semiconductor light-emitting element according to claim 1, wherein the contact layer is between an electrode and the second semiconductor layer.

12. The semiconductor light-emitting element according to claim 11, wherein the contact layer is in direct physical contact with the electrode and the second semiconductor layer.

13. The semiconductor light-emitting element according to claim 1, wherein the concentration for an impurity of the second conductivity-type in the second region is higher than a concentration for an impurity of the second conductivity-type throughout the first region.

14. The semiconductor light-emitting element according to claim 1, wherein the concentration for the impurity of the second conductivity-type throughout the second region is higher than the concentration for the impurity of the second conductivity-type throughout the first region.

15. The semiconductor light-emitting element according to claim 1, wherein a ratio of the concentration for an impurity of the second conductivity-type throughout the portion of the second region to the concentration for an impurity of the second conductivity-type throughout the portion of the first region is from 2 to 20.

16. The semiconductor light-emitting element according to claim 1, wherein the second semiconductor layer contains nitrogen (N) and at least one element of gallium (Ga), aluminum (Al), indium (In), and boron (B).

17. The semiconductor light-emitting element according to claim 1, further comprising:
another electrode electrically connected directly to the first semiconductor layer.

18. A semiconductor device comprising:
the semiconductor light-emitting element according to claim 1.

* * * * *